United States Patent
Alptekin et al.

(10) Patent No.: US 9,397,175 B2
(45) Date of Patent: Jul. 19, 2016

(54) MULTI-COMPOSITION GATE DIELECTRIC FIELD EFFECT TRANSISTORS

(71) Applicant: GLOBALFOUNDRIES INC., Grand Cayman (KY)

(72) Inventors: Emre Alptekin, Wappingers Falls, NY (US); Unoh Kwon, Fishkill, NY (US); Wing L. Lai, Williston, VT (US); Zhengwen Li, Wappingers Falls, NY (US); Vijay Narayanan, New York, NY (US); Ravikumar Ramachandran, Pleasantville, NY (US); Reinaldo A. Vega, Wappingers Falls, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/881,766

(22) Filed: Oct. 13, 2015

(65) Prior Publication Data

US 2016/0035841 A1    Feb. 4, 2016

Related U.S. Application Data

(62) Division of application No. 14/179,121, filed on Feb. 12, 2014, now Pat. No. 9,231,072.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/40* | (2006.01) |
| *H01L 29/51* | (2006.01) |
| *H01L 27/088* | (2006.01) |

(Continued)

(52) U.S. Cl.
CPC ........ *H01L 29/408* (2013.01); *H01L 21/82345* (2013.01); *H01L 21/823462* (2013.01); *H01L 27/088* (2013.01); *H01L 29/513* (2013.01); *H01L 29/517* (2013.01); *H01L 29/66545* (2013.01); *H01L 29/4966* (2013.01); *H01L 29/6659* (2013.01)

(58) Field of Classification Search
CPC ..... H01L 29/49; H01L 29/4933; H01L 29/94; H01L 27/0251; H01L 27/0922
See application file for complete search history.

(56) References Cited

U.S. PATENT DOCUMENTS

| | | |
|---|---|---|
| 7,902,058 B2 | 3/2011 | Datta et al. |
| 8,288,296 B2 | 10/2012 | Wong et al. |

(Continued)

*Primary Examiner* — Hoai V Pham
(74) *Attorney, Agent, or Firm* — Scully, Scott, Murphy & Presser, P.C.

(57) ABSTRACT

A first gate structure and a second gate structure are formed over a semiconductor material layer. The first gate structure includes a planar silicon-based gate dielectric, a planar high-k gate dielectric, a metallic nitride portion, and a first semiconductor material portion, and the second gate structure includes a silicon-based dielectric material portion and a second semiconductor material portion. After formation of gate spacers and a planarization dielectric layer, the second gate structure is replaced with a transient gate structure including a chemical oxide portion and a second high-k gate dielectric. A work-function metal layer and a conductive material portion can be formed in each gate electrode by replacement of semiconductor material portions. A gate electrode includes the planar silicon-based gate dielectric, the planar high-k gate dielectric, and a U-shaped high-k gate dielectric, and another gate electrode includes the chemical oxide portion and another U-shaped high-k gate dielectric.

10 Claims, 11 Drawing Sheets

(51) Int. Cl.
  *H01L 29/66* (2006.01)
  *H01L 21/8234* (2006.01)
  *H01L 29/49* (2006.01)

(56) References Cited

U.S. PATENT DOCUMENTS

| | | |
|---|---|---|
| 2011/0183508 A1 | 7/2011 | Chan et al. |
| 2011/0260244 A1 | 10/2011 | Doyle et al. |
| 2012/0223394 A1 | 9/2012 | Toh et al. |
| 2012/0313170 A1 | 12/2012 | Chang et al. |
| 2012/0315749 A1 | 12/2012 | Hempel et al. |
| 2013/0009257 A1 | 1/2013 | Ando et al. |
| 2013/0015580 A1 | 1/2013 | Jain et al. |
| 2013/0119474 A1 | 5/2013 | Schultz |
| 2014/0183642 A1* | 7/2014 | Liang .............. H01L 21/823412 257/368 |
| 2015/0102416 A1 | 4/2015 | Yin et al. |

\* cited by examiner

US 9,397,175 B2

MULTI-COMPOSITION GATE DIELECTRIC FIELD EFFECT TRANSISTORS

This is a divisional of application Ser. No. 14/179,121 filed Feb. 12, 2014, now U.S. Pat. No. 9,231,072, which is incorporated herein by reference in its entirety.

BACKGROUND

The present disclosure relates to a method of forming a semiconductor structure, and particularly to a method of forming multiple gate dielectrics having different compositions, and structures formed by the same.

Gate dielectrics having different thicknesses are useful in providing a variety of field effect transistors on a same substrate. Replacement gate field effect transistors are compatible with high dielectric constant (high-k) gate dielectrics and metal gates. However, integration schemes that employ replacement gate field effect transistors tend to physically expose silicon-oxide-based dielectric material portions to damaging etch processes prior to deposition of a high-k gate dielectric material thereupon. In order to provide reliable semiconductor devices of various types, an integration scheme is desired that allows use of replacement gate structures with multiple types of gate dielectrics without damaging silicon-oxide-based dielectric material portions.

SUMMARY

A stack of a silicon-based dielectric material layer, a high dielectric constant (high-k) material layer, and a metallic nitride layer is formed over a surface of a semiconductor substrate. The stack is patterned to remove the metallic nitride layer and the high-k material layer from one region, while another region is protected by a temporary mask layer. A semiconductor material layer is subsequently deposited after removal of the temporary mask layer. The remaining portions of the stack of the semiconductor material layer are patterned to form a first gate structure including a planar silicon-based gate dielectric, a planar high-k gate dielectric, a metallic nitride portion, and a first semiconductor material portion, and a second gate structure including a silicon-based dielectric material portion and a second semiconductor material portion. After formation of gate spacers and a planarization dielectric layer, the second gate structure is replaced with a replacement gate structure including a chemical oxide portion, a second high-k gate dielectric, another metallic nitride portion, and a third semiconductor material portion. Each of the first semiconductor material portion and the third semiconductor material portion can be replaced with a stack of a work-function metal layer and a conductive material portion. A gate electrode includes the planar silicon-based gate dielectric, the planar high-k gate dielectric, and a U-shaped high-k gate dielectric, and another gate electrode includes the chemical oxide portion and another U-shaped high-k gate dielectric.

According to an aspect of the present disclosure, a method of forming a semiconductor structure is provided. A first material stack and a second material stack are formed on a semiconductor substrate. The first material stack includes at least a planar semiconductor oxide-based dielectric portion and a first disposable material portion. The second material stack includes at least a second disposable material portion. A planarization dielectric layer is formed around the first and second material stacks. The second material stack is replaced with a stack including a chemical oxide layer and a U-shaped high-k dielectric portion. The first disposable material portion is removed. By deposition and planarization of a work function material layer and a conductive material layer, a first gate electrode is formed over the planar semiconductor oxide-based dielectric portion, and a second gate electrode is formed within a volume laterally bounded by the U-shaped high-k dielectric portion.

According to another aspect of the present disclosure, a semiconductor structure includes a first field effect transistor and a second field effect transistor located on a semiconductor substrate. The first field effect transistor includes a first gate structure and the second field effect transistor includes a second gate structure. The first gate structure includes a stack of a planar semiconductor oxide-based dielectric portion, a planar high dielectric constant (high-k) dielectric portion, and a first gate electrode. The second gate structure includes a stack of a chemical oxide layer contacting a surface of the semiconductor substrate, a U-shaped high-k dielectric portion, and a second gate electrode laterally surrounded by vertical portions of the U-shaped high-k dielectric portion.

DETAILED DESCRIPTION

Figure 1:
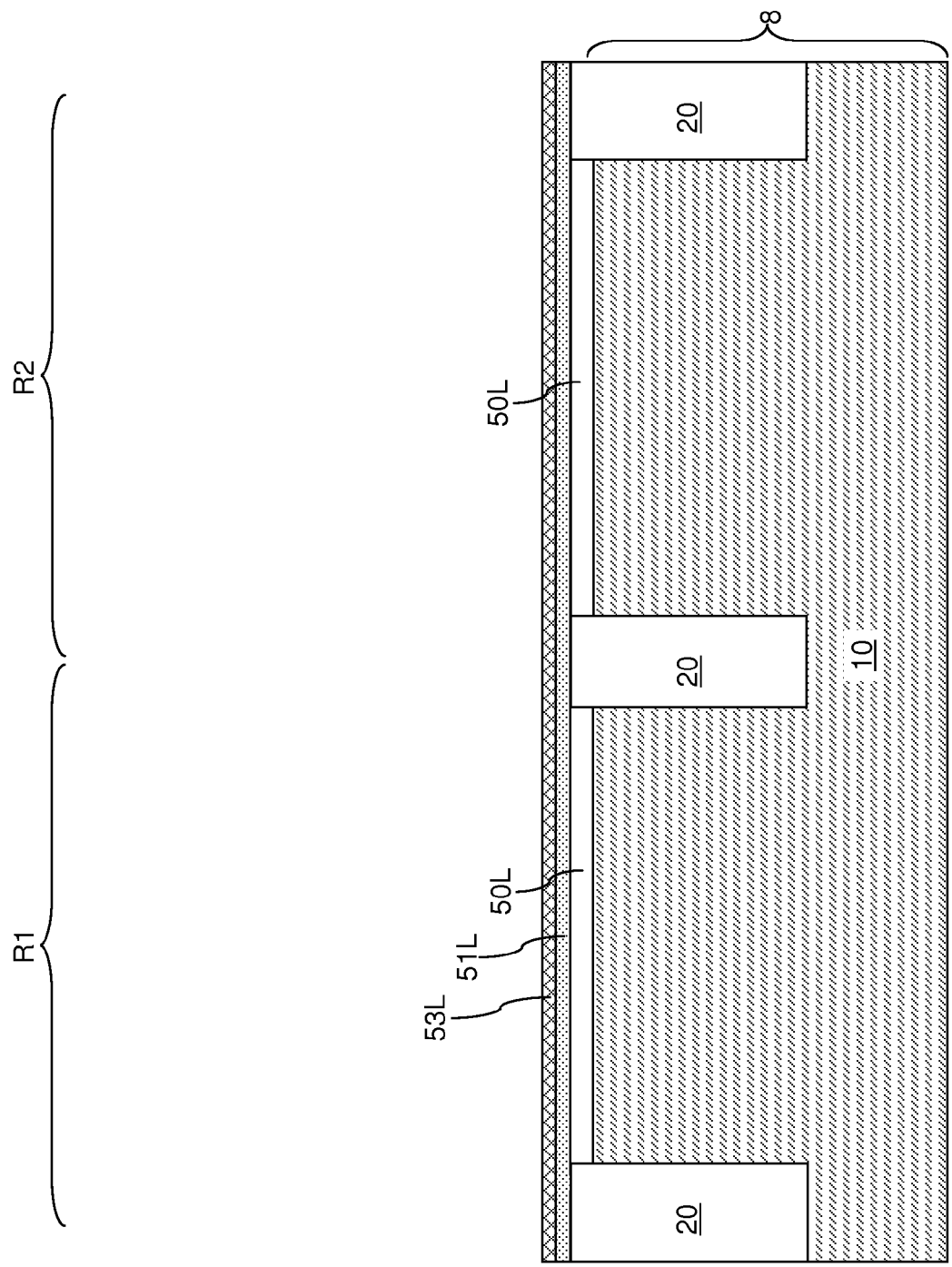
FIG. 1 is a vertical cross-sectional view of a first exemplary semiconductor structure after formation of a vertical stack including a planar semiconductor oxide-based dielectric layer, a planar high dielectric constant (high-k) dielectric layer, and a planar metallic material layer according to a first embodiment of the present disclosure.

As stated above, the present disclosure relates to a method of forming multiple gate dielectrics having different thicknesses, and structures formed by the same. Aspects of the present disclosure are now described in detail with accompanying figures. Like and corresponding elements mentioned herein and illustrated in the drawings are referred to by like reference numerals. The drawings are not necessarily drawn to scale. Ordinals are used merely to distinguish among similar elements, and different ordinals may be employed across the specification and the claims of the instant application.

Referring to FIG. 1, a first exemplary semiconductor structure according to a first embodiment of the present disclosure includes a semiconductor substrate 8 that includes a semiconductor material layer 10. Various semiconductor devices including field effect transistors can be subsequently formed on the semiconductor material layer 10. The semiconductor substrate 8 can be a bulk substrate including a bulk semiconductor material constituting the semiconductor material layer 10 throughout, or a semiconductor-on-insulator (SOI) substrate (not shown) containing a top semiconductor layer that constitutes a semiconductor material layer 10, a buried insulator layer (not shown) located under the top semiconductor layer, and a bottom semiconductor layer (not shown) located under the buried insulator layer.

Various portions of the semiconductor material in the semiconductor substrate 8 can be doped with electrical dopants of p-type or n-type at different dopant concentration levels. For example, the semiconductor substrate 8 may include at least one p-type well (not shown) and/or at least one n-type well (not shown). Shallow trench isolation structures 20 can be formed to laterally separate various surface regions of the semiconductor substrate 8.

A planar semiconductor oxide-based dielectric layer 50L can be deposited on the top surface of the semiconductor substrate 8. As used herein, a "planar" element refers to an element having a uniform thickness throughout and does not include any vertically extending portion. The planar semiconductor oxide-based dielectric layer 50L includes a semiconductor-oxide based dielectric material. As used herein, a "semiconductor oxide-based dielectric material" refers to a dielectric material that includes a semiconductor oxide as a predominant component. As used herein, a "predominant component" of a material refers to a component that accounts for more than 50% of all atoms within the material. As used herein, a "semiconductor material" can be any of the elemental semiconductor materials known in the art, an alloy of at least two elemental semiconductor materials, a III-V compound semiconductor material, a II-VI compound semiconductor material, or a combination thereof. As used herein, a "semiconductor oxide" refers to an oxide of a semiconductor material. A semiconductor oxide-based dielectric material may consist of a semiconductor oxide, a semiconductor oxynitride, or a vertical stack of at least one semiconductor oxide layer and at least one semiconductor oxynitride layer.

In one embodiment, the planar semiconductor oxide-based dielectric layer 50L can be formed by thermal oxidation, a combination of thermal oxidation and thermal or plasma nitridation, plasma oxidation, a combination of plasma oxidation and thermal or plasma nitridation, of a physically exposed top portion of the semiconductor material layer 10. The thickness of planar semiconductor oxide-based dielectric layer 50L can be in a range from 1.5 nm to 10 nm, although lesser and greater thicknesses can also be employed. The planar semiconductor oxide-based dielectric layer 50L can be formed as a single contiguous layer, or can be formed in multiple portions that are laterally spaced from one another by the shallow trench isolation structures 20.

A planar high dielectric constant (high-k) dielectric layer 51L is formed on the top surface of the planar semiconductor oxide-based dielectric layer 50L. The planar high-k dielectric layer 51L includes a high-k dielectric material. As used herein, a high-k dielectric material refers to a dielectric material having a dielectric constant greater than the dielectric constant of silicon nitride, i.e., 7.9. In one embodiment, the high-k dielectric material of the planar high-k dielectric layer 51L can have a dielectric constant greater than 8.0. In one embodiment, the high-k dielectric material layer can include a dielectric metal oxide, which is a high-k material containing a metal and oxygen.

Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the planar high-k dielectric layer 51L can be from 0.9 nm to 6 nm, although lesser and greater thicknesses can also be employed. In one embodiment, the planar high-k dielectric layer 51L may have an effective oxide thickness on the order of or less than 2 nm. In an illustrative example, the planar high-k dielectric layer 51L may be a hafnium oxide ($HfO_2$) layer.

A planar metallic material layer 53L can be formed on the top surface of the planar high-k dielectric layer 51L. The planar metallic material layer 53L includes a metallic material, which can be a conductive metallic nitride, a conductive metallic carbide, an elemental metal, or an intermetallic alloy. In one embodiment, the planar metallic material layer 53L includes a conductive metallic nitride. In an illustrative example, the planar metallic material layer 53L can include titanium nitride.

The material of the planar metallic material layer 53L can be deposited, for example, by physical vapor deposition (PVD), chemical vapor deposition (CVD), atomic layer deposition (ALD), vacuum evaporation, or a combination thereof. The thickness of the planar metallic material layer 53L can be in a range from 1 nm to 6 nm, although lesser and greater thicknesses can also be employed.

The vertical stack of the planar semiconductor oxide-based dielectric layer 50L, the planar high-k dielectric layer 51L, and the planar metallic material layer 53L can be formed on the entirety of the top surface of the substrate 8, which can include multiple device regions. The multiple device regions can include, for example, a first device region R1 and a second device region R2.

Figure 2:
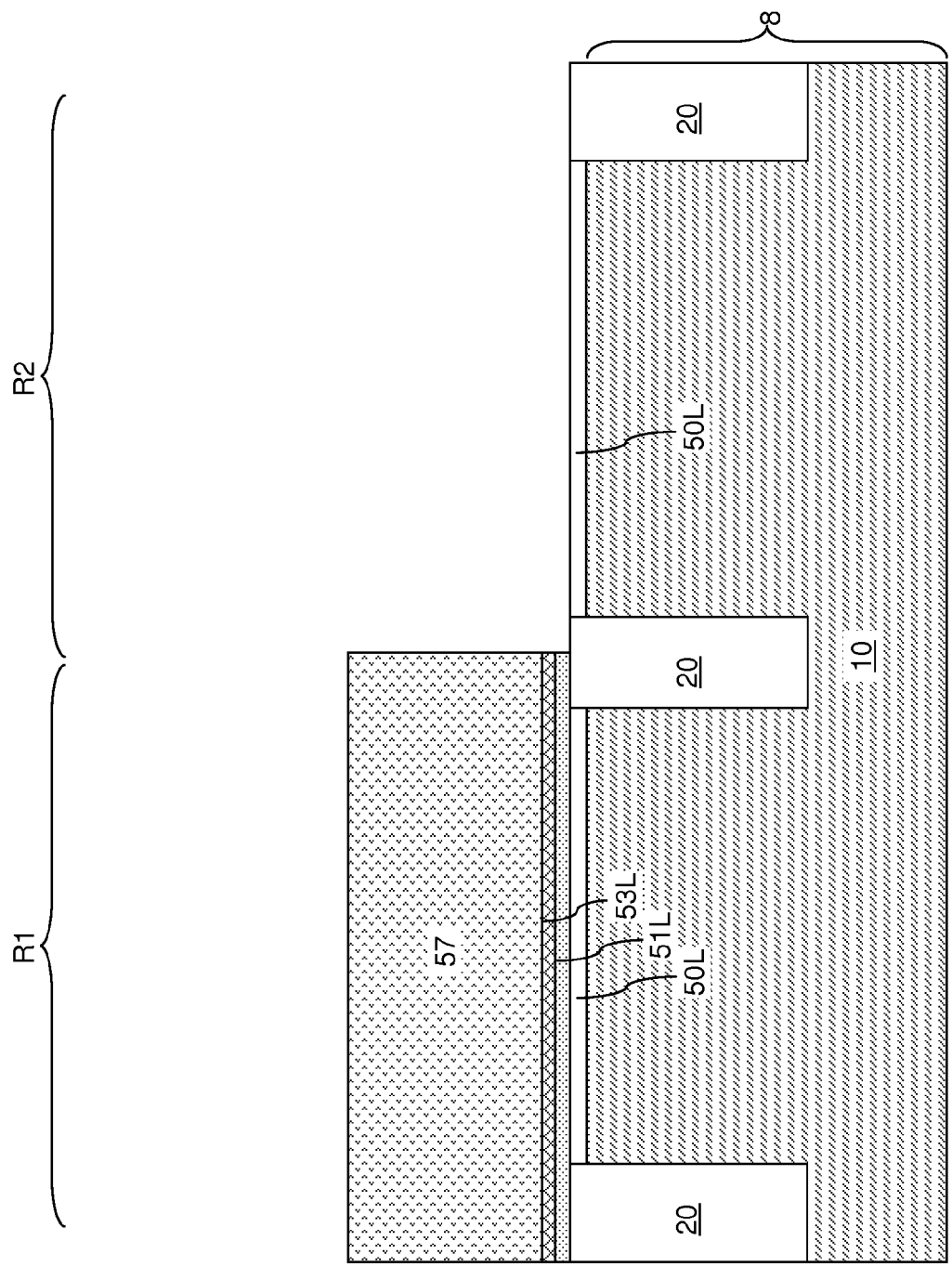
FIG. 2 is a vertical cross-sectional view of the first exemplary semiconductor structure after masking the vertical stack in a first device region and removing physically exposed portions of the planar metallic material layer and the planar high-k dielectric layer in a second device region according to the first embodiment of the present disclosure.

Referring to FIG. 2, a masking layer 57 can be formed over the vertical stack of the planar semiconductor oxide-based dielectric layer 50L, the planar high-k dielectric layer 51L, and the planar metallic material layer 53L. The masking layer 57 can be formed as a blanket (unpatterned) layer, and can be patterned to cover a top surface of the vertical stack (50L, 51L, 53L) in the first device region R1, while physically exposing the vertical stack (50L, 51L, 53L) in the second device region R2. In one embodiment, the masking layer 57 can be a photoresist layer that is patterned employing lithographic methods.

The physically exposed portions of the planar metallic material layer 53L and the planar high-k dielectric layer 51L in the second device region R2 can be removed selective to the planar semiconductor oxide-based dielectric layer 50L by at least one etch, which can include an isotropic etch and/or an anisotropic etch. For example, a wet etch chemistry that etches the material of the planar metallic material layer 53L can be employed in a first etch, followed by another wet etch chemistry that etches the material of the planar high-k dielectric layer 51L selective to the material of the planar semiconductor oxide-based dielectric layer 50L. The masking layer 57 can be subsequently removed, for example, by ashing.

Figure 3:
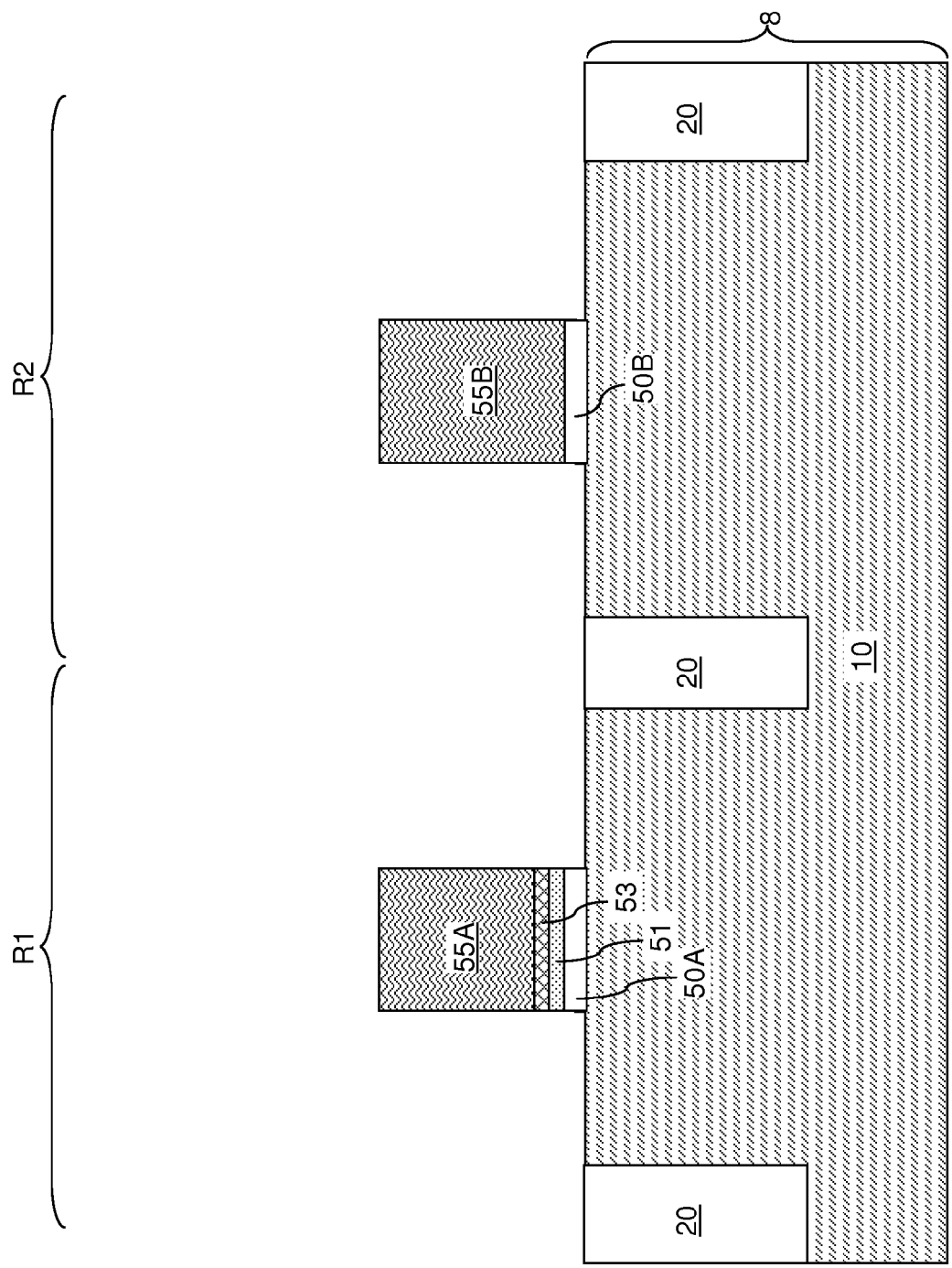
FIG. 3 is a vertical cross-sectional view of the first exemplary semiconductor structure after deposition of a disposable material layer and formation of a first material stack and a second material stack by patterning the disposable material layer and remaining portions of the vertical stack according to the first embodiment of the present disclosure.

Referring to FIG. 3, a disposable material layer is deposited directly on the top surface of the planar metallic material layer 53L and on the top surface of the planar semiconductor oxide-based dielectric layer 50L. The disposable material layer includes a disposable material, i.e., a material that is subsequently removed.

The disposable material layer includes a material that can be subsequently removed selective to the material of the planar semiconductor oxide-based dielectric layer 50L and selective to dielectric materials of gate spacers and a planarization dielectric layer to be subsequently deposited above the top surface of the semiconductor substrate 8. For example, the disposable material layer can include a semiconductor material such as silicon, germanium, a silicon germanium alloy, or a compound semiconductor material. Alternately, the disposable material layer can include any dielectric material or any metallic material that can be removed selective to the dielectric materials of the gate spacer and the dielectric layer to be subsequently deposited. Yet alternately, the disposable material layer can include an organic material, amorphous carbon, or any other disposable fill material known in the art provided that the disposable fill material can be removed selective to the material of the planar semiconductor oxide-based dielectric layer and selective to dielectric materials of gate spacers and a planarization dielectric layer to be subsequently deposited above the top surface of the semiconductor substrate 8. The thickness of the disposable material layer can be in a range from 30 nm to 600 nm, although lesser and greater thicknesses can also be employed. In an illustrative example, the disposable material layer can include polysilicon.

The stack of the disposable material layer, the planar metallic material layer 53L, the planar high-k dielectric layer 51L, and the planar semiconductor oxide-based dielectric layer 50L is subsequently lithographically patterned to form material stacks. For example, a photoresist layer (not shown) can be applied over the disposable material layer, and can be lithographically patterned to cover areas in which formation of material stacks is desired. The pattern in the photoresist layer can be transferred through the stack of the disposable material layer, the planar metallic material layer 53L, the planar high-k dielectric layer 51L, and the planar semiconductor oxide-based dielectric layer 50L by at least etch, which can include at least one anisotropic etch. Remaining portions of the stack of the disposable material layer, the planar metallic material layer 53L, the planar high-k dielectric layer 51L, and the planar semiconductor oxide-based dielectric layer 50L constitute various material stacks. The last step of the etch that removes physically exposed portions of the planar semiconductor oxide-based dielectric layer 50L can be selective to the semiconductor material of the semiconductor material layer 10. The photoresist layer can be subsequently removed, for example, by ashing.

A first material stack (50A, 51, 53, 55A) can be formed in the first device region R1, and a second material stack (50B, 55B0 can be formed in the second device region R2. The sidewalls of various elements within the same material stack can be vertically coincident with one another. As used herein, two surfaces are vertically coincident with each other if the two surfaces are located within the same vertical plane.

The first material stack (50A, 51, 53, 55A) can include a first planar semiconductor oxide-based dielectric portion 50A, a planar high-k dielectric portion 51, a planar metallic material portion 53, and a first disposable material portion 55A. The second material stack (50B, 55B) can include a second planar semiconductor oxide-based dielectric portion 50B and a second disposable material portion 55B. The first and second planar semiconductor oxide-based dielectric portions (50A, 50B) are remaining portions of the planar semiconductor oxide-based dielectric layer 50L, the planar high-k dielectric portion 51 is a remaining portion of the planar high-k dielectric layer 51L, the planar metallic material portion 53 is a remaining portion of the planar metallic material layer 53L, and the first and second disposable material portions (55A, 55B) are remaining portions of the disposable material layer.

The planar high-k dielectric material portion 51 can contact the first planar semiconductor oxide-based dielectric portion 50A, and underlies the first disposable material portion 55A. The planar metallic material portion 53 can contact the planar high-k dielectric material portion 51 and the first disposable material portion 55A. The second disposable material portion 55B can contact the second planar semiconductor oxide-based dielectric portion 50B.

Figure 4:
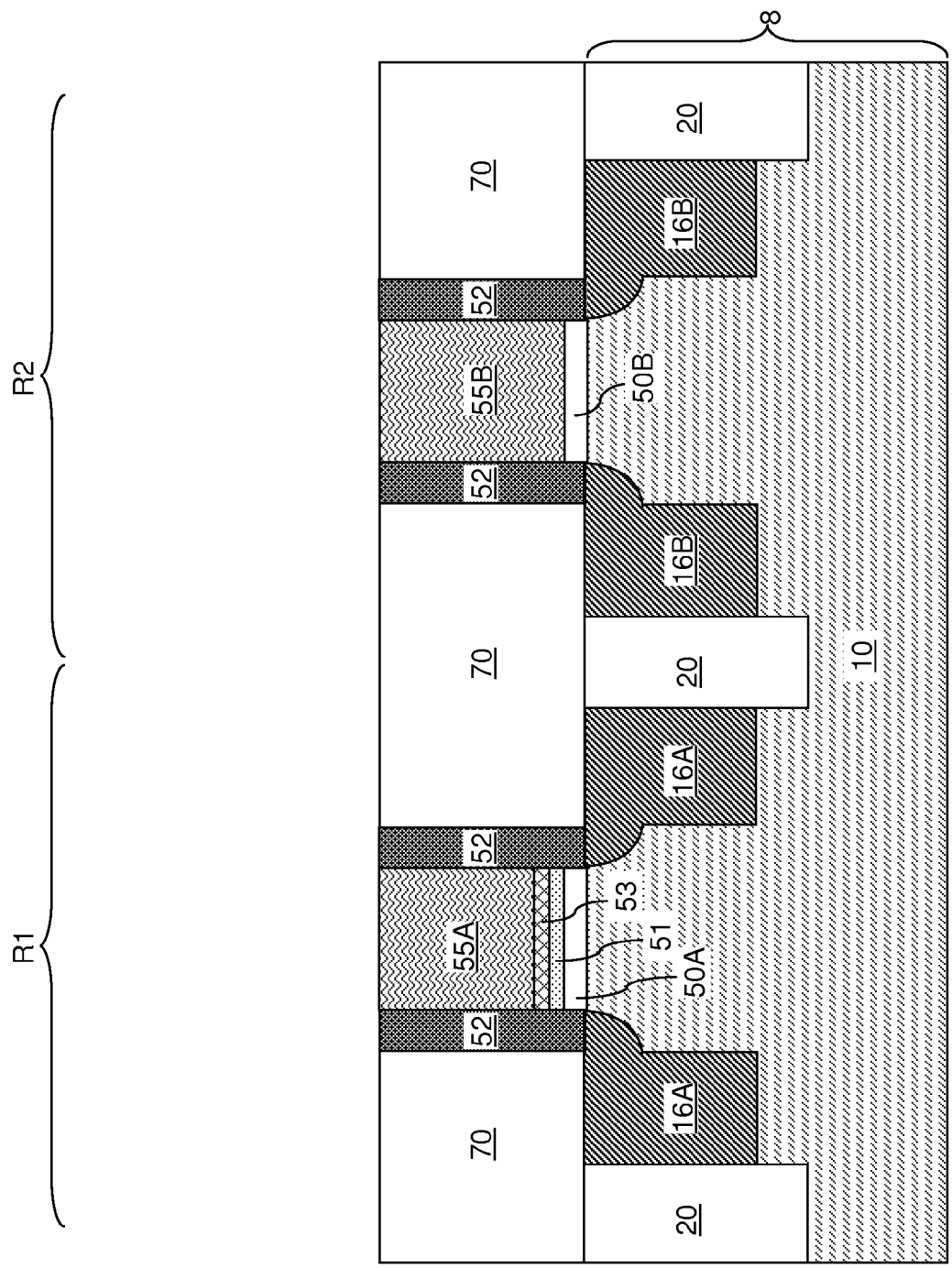
FIG. 4 is a vertical cross-sectional view of the first exemplary semiconductor structure after formation of various source and drain regions, gate spacers, and a planarization dielectric layer according to the first embodiment of the present disclosure.

Referring to FIG. 4, gate spacers 52 can be formed on sidewalls of each of the material stacks, for example, by deposition of a conformal dielectric material layer and an anisotropic etch. The conformal dielectric material layer includes a dielectric material that is resistant to the etch chemistry to be subsequently employed to remove the disposable material portions (55A, 55B). For example, the conformal dielectric material layer can include silicon oxide, silicon nitride, silicon oxynitride, a high dielectric constant dielectric material having a dielectric constant greater than 7.9 and including a dielectric oxide of a metal, or combinations thereof. The conformal dielectric material layer can be deposited, for example, by chemical vapor deposition (CVD) or atomic layer deposition (ALD). The anisotropic etch removes horizontal portions of the conformal dielectric material layer. Remaining vertical portions of the conformal dielectric material layer constitute the gate spacers 52.

At least one masked ion implantation process and/or at least one unmask ion implantation process can be performed before and/or after formation of the gate spacers 52. If a masked ion implantation is employed, a masking structure including a combination of a patterned masking material layer (not shown) and the material stacks (50A, 51, 53, 55A, 50B, 55B) can be employed during the masked ion implantation process. If an unmasked ion implantation process is employed, the material stacks (50A, 51, 53, 55A, 50B, 55B) can be employed as a masking structure during the unmasked ion implantation process. The at least one ion implantation process can form various doped active regions (16A, 16B) within the semiconductor material layer 10. As used herein, doped active regions collectively refer to source regions, drain regions, source extension regions, and drain extension regions as known in the art. Each doped active region (16A, 16B) can have a doping of an opposite conductivity type than the portion of the semiconductor material layer 10 in which the doped active region (16A, 16B) is formed.

A planarization dielectric layer 70 can be formed above the doped active regions (16A, 16B) and at least up to the height of the top surface of the material stacks (50A, 51, 53, 55A, 50B, 55B). The planarization dielectric layer 70 includes a dielectric material such as silicon oxide, silicon nitride, silicon oxynitride, a dielectric metal oxide, porous or non-porous organosilicate glass, or a combination thereof. In one embodiment, the planarization dielectric layer 70 includes a dielectric material that is resistant to the etch chemistry to be subsequently employed to remove the disposable material portions (55A, 55B).

In one embodiment, the planarization dielectric layer 70 includes a spin-on dielectric material. In one embodiment, the planarization dielectric layer 70 can be formed by chemical vapor deposition (CVD) and/or atomic layer deposition (ALD). The planarization dielectric layer 70 can be planarized employing the top surfaces of the disposable material portions (55A, 55B) as stopping surfaces. The planarization of the planarization dielectric layer 70 can be effected, for example, by a recess etch or chemical mechanical planarization (CMP). If CMP is employed, the top surfaces of the gate spacers 52 can be employed as stopping surfaces for the planarization step. The top surface of the planarization dielectric layer 70 can be coplanar with the top surfaces of the disposable material portions (55A, 55B). Thus, the planarization dielectric layer 70 is formed over the semiconductor substrate 8 and around the material stacks (50A, 51, 53, 55A, 50B, 55B).

Figure 5:
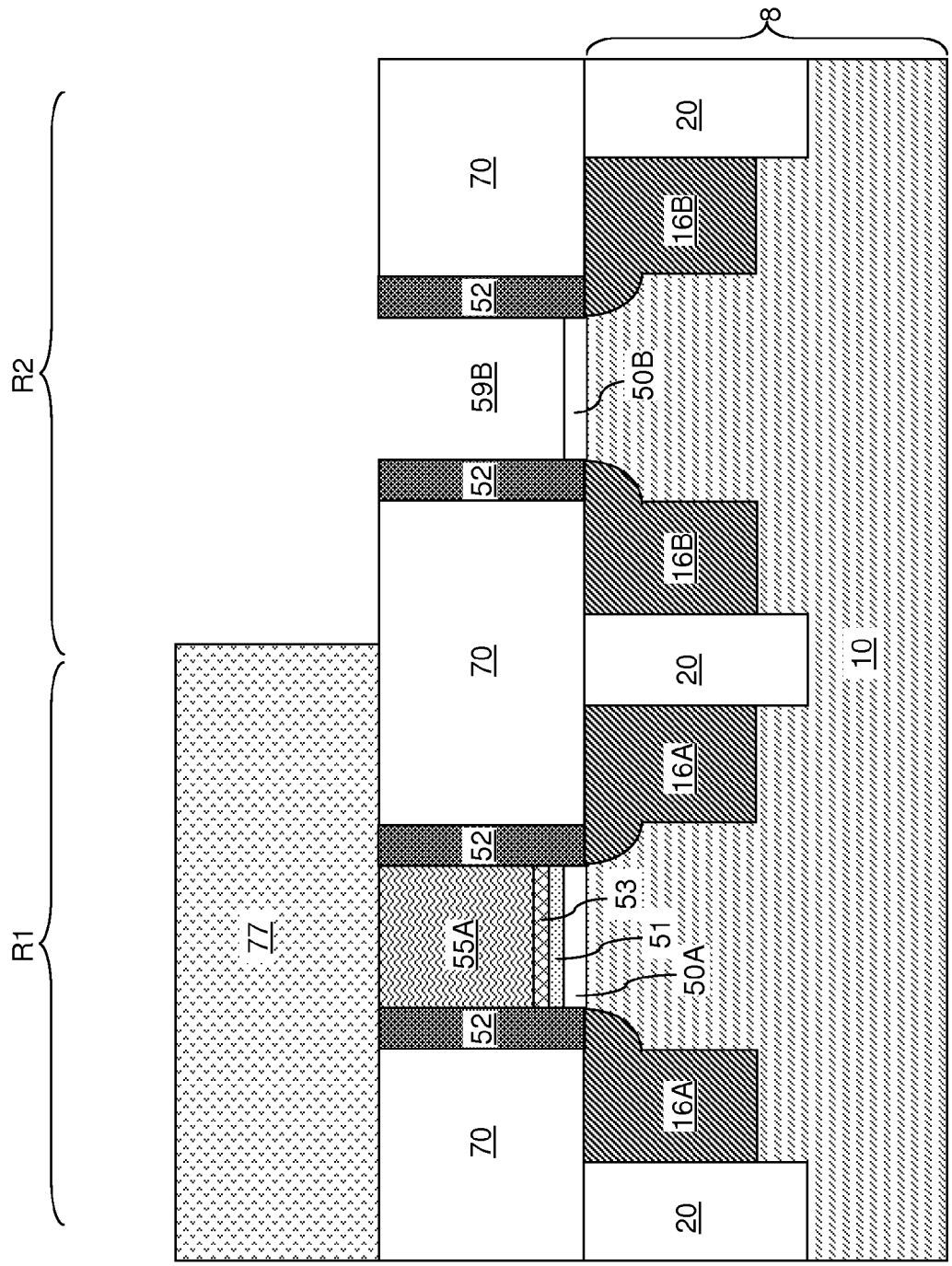
FIG. 5 is a vertical cross-sectional view of the first exemplary semiconductor structure after masking of the first material stack and removal of a second disposable material portion according to the first embodiment of the present disclosure.

Referring to FIG. 5, a mask layer 77 is formed over the planarization dielectric layer 70, and is patterned to cover the first device region R1, while not covering the second device region R2. The mask layer 77 can be, for example, a photoresist layer. The patterning of the mask layer 77 can be performed employing any method known in the art. For example, if the mask layer 77 is a photoresist layer, the mask layer 77 can be patterned employing lithographic exposure and development. The first material stack (50A, 51, 53, 55A) is masked by the patterned mask layer 77, and the second disposable material portion 55B is subsequently removed.

The second disposable material portion 55B in the second device region R2 is removed selective to the gate spacers 52 and the planarization dielectric layer 70 while the patterned mask layer 77 prevents removal of the first disposable material portion 55A that is present in the first device region R1. For example, if the second disposable material portion 55B includes a polycrystalline semiconductor material, the removal of the second disposable material portion 55B can be performed by an isotropic or anisotropic dry etch employing hydrochlorocarbons, hydrogen chloride, and/or any other etchant that removes a semiconductor material selective to dielectric materials such as silicon oxide or silicon nitride. The removal of the second disposable material portion 55B may, or may not, be selective to the dielectric material of the second planar semiconductor oxide-based dielectric portion 50B. A gate cavity, which is herein referred to as a gate cavity 59B, is formed in the volume from which the second disposable material portion 55B is removed.

Figure 6:
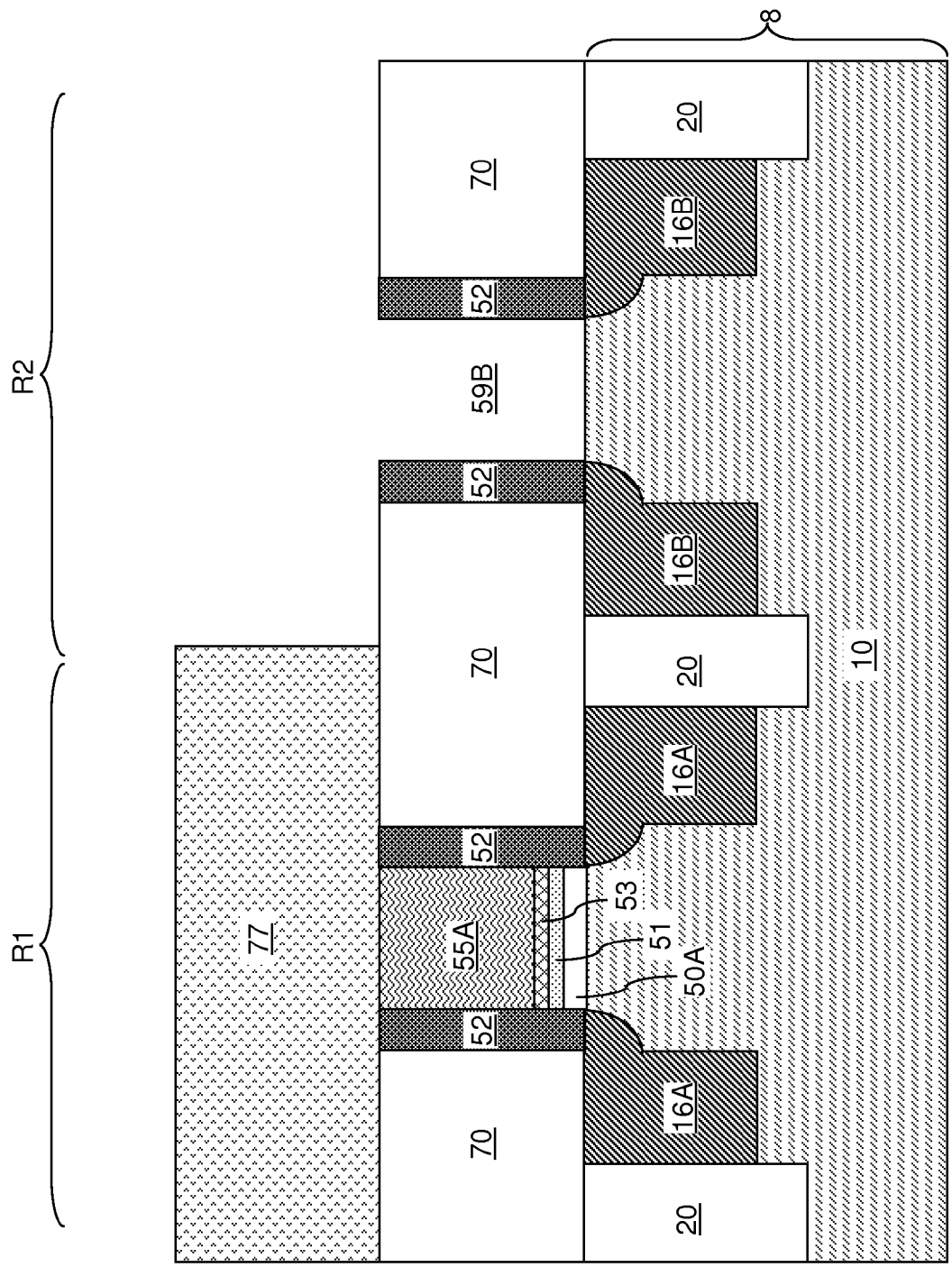
FIG. 6 is a vertical cross-sectional view of the first exemplary semiconductor structure after removal of a second planar semiconductor oxide-based dielectric portion according to the first embodiment of the present disclosure.

Referring to FIG. 6, the second planar semiconductor oxide-based dielectric portion 50B is removed by an etch, which can be an isotropic etch or an anisotropic etch. In one embodiment, the second planar semiconductor oxide-based dielectric portion 50B can be removed selective to the gate spacers 52 employing a wet etch chemistry. In an illustrative example, if the gate spacer 52 includes silicon nitride, the second planar semiconductor oxide-based dielectric portion 50B can be removed by a wet etch employing hydrofluoric acid. Collateral etching of the planarization dielectric layer 70 may occur depending on the composition of the planarization dielectric layer 70 and the etch chemistry. The patterned mask layer 77 can be subsequently removed, for example, by ashing.

Figure 7:
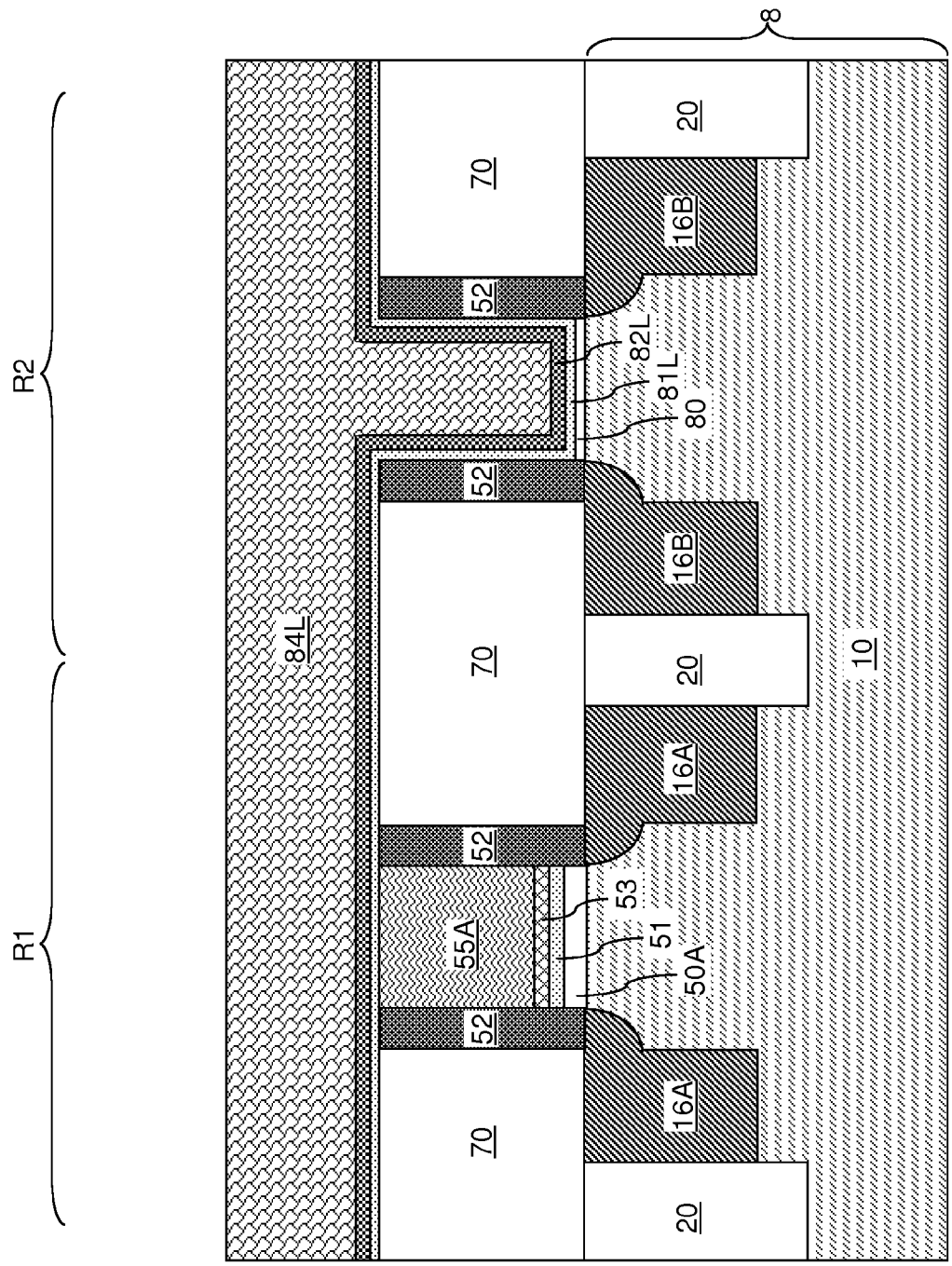
FIG. 7 is a vertical cross-sectional view of the first exemplary semiconductor structure after formation of a chemical oxide layer, a contiguous high-k dielectric layer, a contiguous metallic material layer, and a fill material layer according to the first embodiment of the present disclosure.

Referring to FIG. 7, a chemical oxide layer 80 may be formed by treatment of exposed semiconductor surfaces underneath the gate cavity 59B with a chemical. For example, the process step for this wet chemical oxidation may include treating a cleaned semiconductor surface (such as a semiconductor surface treated with hydrofluoric acid) with a mixture of ammonium hydroxide, hydrogen peroxide and water (in a 1:1:5 ratio) at a temperature about 65° C. Alternately, the chemical oxide layer 80 can also be formed by treating the HF-last semiconductor surface in ozonated aqueous solutions, with the ozone concentration usually varying from, but not limited to, 2 parts per million (p.p.m.) to 40 p.p.m. The chemical oxide layer 80 helps minimize mobility degradation in the semiconductor material layer 10 due to a high-k dielectric material to be subsequently formed on the chemical oxide layer 80. In case the semiconductor material layer 10 is a silicon layer, the chemical oxide layer 80 is a silicon oxide layer. Typically, the thickness of the chemical oxide layer 80 is from 0.1 nm to 0.4 nm, although lesser and greater thicknesses can also be employed.

A contiguous high-k dielectric layer 81L is formed directly on the top surface of the chemical oxide layer 80 and the sidewall surface of a gate spacer 52 in the second device region R2 and the top surfaces of the planarization dielectric layer 70. The contiguous high-k dielectric layer 81L can be a single contiguous layer of a dielectric material having a dielectric constant greater than 7.9. The contiguous high-k dielectric layer 81L can be a conformal layer having a same thickness at vertical portions and at horizontal portions. The contiguous high-k dielectric layer 81L can be formed on the chemical oxide layer 80, the top surface of the planarization dielectric layer 70, and the top surface of the first disposable material portion 55A.

The contiguous high-k dielectric layer 81L can be formed employing any of the methods that can be employed to form the planar high-k dielectric layer 51L. Further, the contiguous high-k dielectric layer 81L can include any of the high-k dielectric material that can be employed for the planar high-k dielectric layer 51L. The thickness of the contiguous high-k dielectric layer 81L can be from 0.9 nm to 6 nm, although lesser and greater thicknesses can also be employed. The thickness of the contiguous high-k dielectric layer 81L may be greater than, equal to, or less than, the thickness of the planar high-k dielectric layer 51L. The composition of the contiguous high-k dielectric layer 81L can be the same as, or different from, the composition of the planar high-k dielectric layer 51L.

A contiguous metallic material layer 82L can be formed on the surfaces of the contiguous high-k dielectric layer 81L. The contiguous metallic material layer 82L can be a contiguous conductive material layer. The contiguous metallic material layer 82L can be a conformal layer or a non-conformal layer. The contiguous metallic material layer 82L can be formed employing any of the methods that can be employed to form the planar metallic material layer 53L. Further, the contiguous metallic material layer 82L can include any of the metallic material that can be employed for the planar metallic material layer 53L. The thickness of the contiguous metallic material layer 82L can be in a range from 1 nm to 6 nm, although lesser and greater thicknesses can also be employed. The thickness of the contiguous metallic material layer 82L may be greater than, equal to, or less than, the thickness of the planar metallic material layer 53L. The composition of the contiguous metallic material layer 82L can be the same as, or different from, the composition of the planar metallic material layer 53L.

A fill material layer 84L is deposited on the contiguous metallic material layer 82L, for example, by chemical vapor deposition (CVD), physical vapor deposition (CVD), or vacuum evaporation. The fill material layer 84L includes a material that can be subsequently removed selective to the metallic material of the contiguous metallic material layer 82L. For example, the fill material layer 84L can include a semiconductor material such as silicon, germanium, a silicon germanium alloy, or a compound semiconductor material. Alternately, the fill material layer 84L can include any dielectric material or any metallic material that can be removed selective to the metallic material of the contiguous metallic material layer 82L. Yet alternately, the fill material layer can include an organic material, amorphous carbon, or any other disposable fill material known in the art provided that the disposable fill material can be removed selective to the material of the metallic material of the contiguous metallic material layer 82L.

The material of the fill material layer 84L may, or may not, be the same as the material of the first disposable material portion 55A (which is derived from the disposable material layer). The thickness of the fill material layer 84L is selected such that the gate cavity 59B (See FIG. 6) is completely filled by the fill material layer 84L. In one embodiment, the thickness of the fill material layer 84L, as measured above the top surface of the planarization dielectric layer 70, can be in a range from 30 nm to 600 nm, although lesser and greater thicknesses can also be employed. In an illustrative example, the fill material layer 84L can include polysilicon.

Thus, a stack of material layers fill the gate cavity 59B. The stack of material layers include the chemical oxide layer 80, the contiguous high-k dielectric layer 81L, the contiguous metallic material layer 82L, and the fill material layer 84L.

Figure 8:
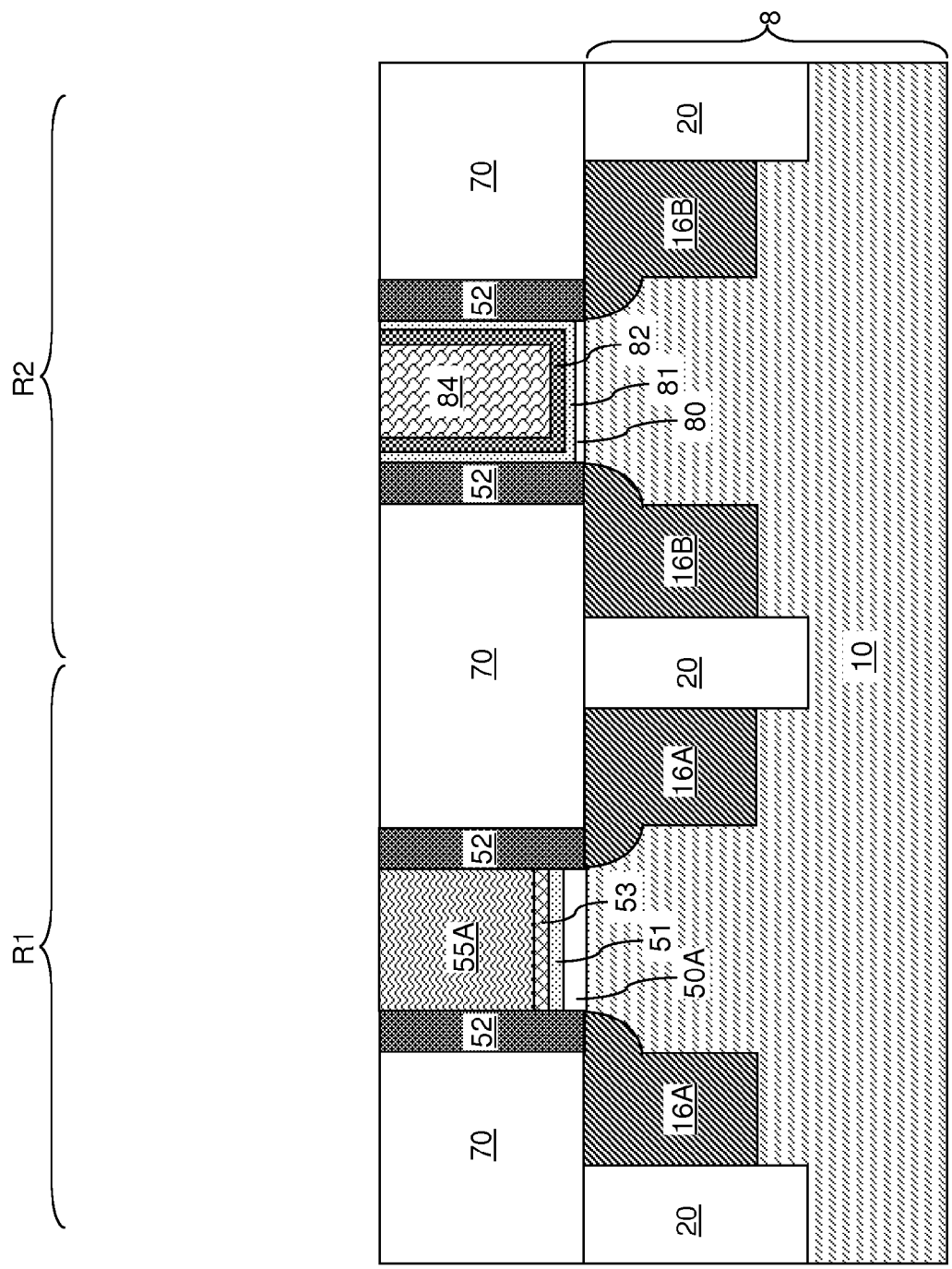
FIG. 8 is a vertical cross-sectional view of the first exemplary semiconductor structure after planarization of the fill material layer, the contiguous metallic material layer, and the contiguous high-k dielectric layer from above the top surface of the planarization dielectric layer according to the first embodiment of the present disclosure.

Referring to FIG. 8, the portions of the fill material layer 84L, the contiguous metallic material layer 82L, and the contiguous high-k dielectric layer 81L located above the top surface of the planarization dielectric layer 70 can be removed by a planarization process. The planarization process can include a recess etch, chemical mechanical planarization (CMP), or a combination thereof. The remaining portion of the contiguous high-k dielectric layer 81L after the planarization process is herein referred to as a U-shaped high-k dielectric portion 81. The remaining portion of the contiguous metallic material layer 82L after the planarization process is herein referred to as a U-shaped metallic material portion 82. The remaining portion of the fill material layer 84L after the planarization process is herein referred to as a fill material portion 84.

As used herein, a "U-shaped" element refers to an element that includes a pair of vertical portions and a horizontal portion such that the bottommost sub-portions of the vertical portions are adjoined to the horizontal portion. The processing steps of FIGS. 5-8 replaces the second stack structure (50B, 55B) with a stack including the chemical oxide layer 80, the U-shaped high-k dielectric portion 81, the U-shaped metallic material portion 82, and the fill material portion 84.

Figure 9:
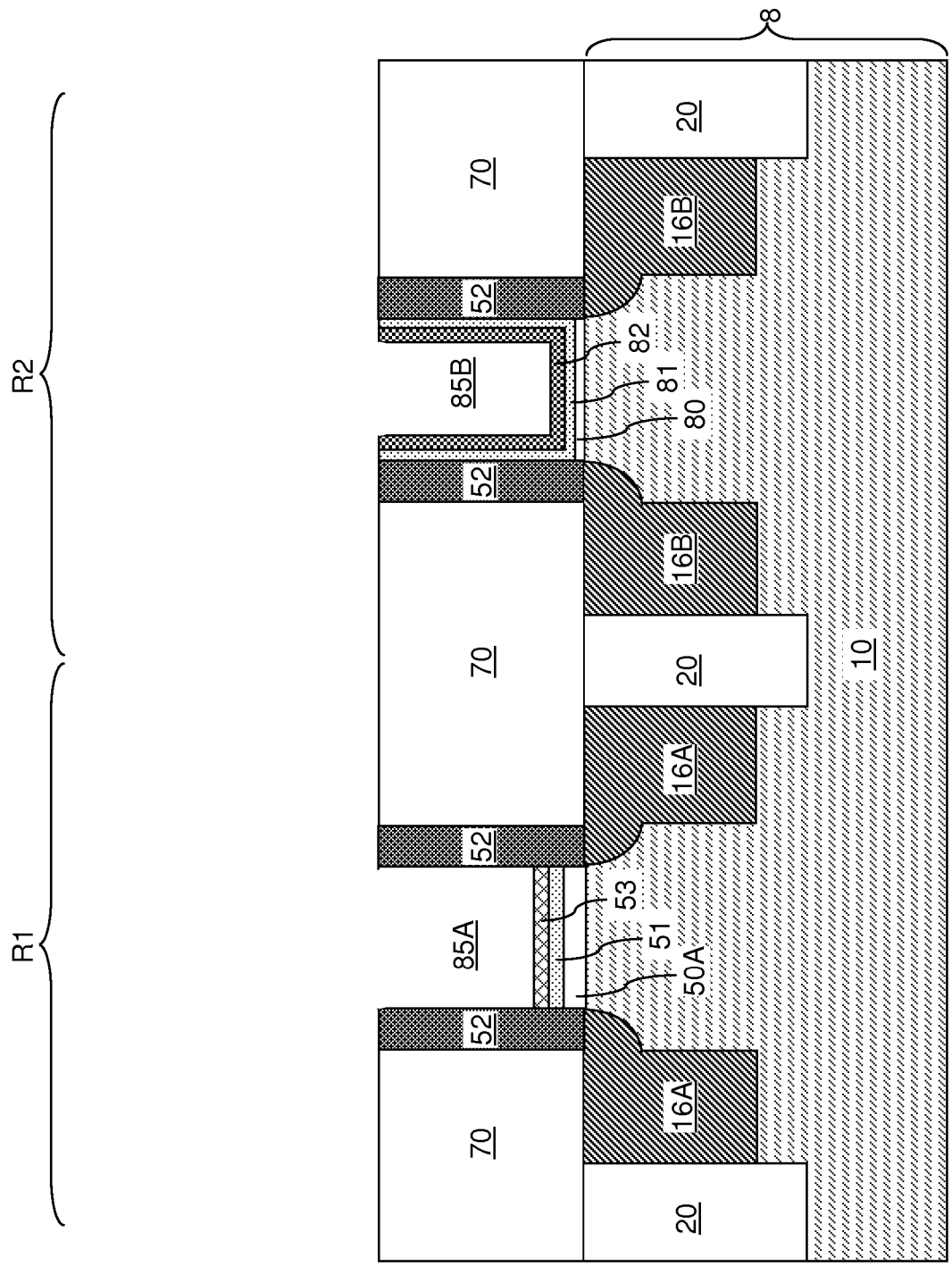
FIG. 9 is a vertical cross-sectional view of the first exemplary semiconductor structure after removal of a first disposable material portion and a filler material portion according to the first embodiment of the present disclosure.

Referring to FIG. 9, the first disposable material portion 55A and the filler material portion 84 can be removed selective to the planarization dielectric layer 70 and the gate spacers 52. In one embodiment, the removal of the first disposable material portion 55A and the filler material portion 84 can be selective to the material of the planar metallic material portion 53 and the U-shaped metallic material portion 82. The removal of the first disposable material portion 55A and the filler material portion 84 can be performed by an etch, which can be an isotropic etch or an anisotropic etch. In one embodiment, if the first disposable material portion 55A and the filler material portion 84 include semiconductor materials, a dry etch or a wet etch employing hydrofluorocarbon etchant and/or hydrogen chloride can be employed to etch the first disposable material portion 55A and the filler material portion 84. The removal of the first disposable material portion 55A and the filler material portion 84 may be performed simultaneously, or one of the first disposable material portion 55A and the filler material portion 84 may be removed prior to, or after, removal of the other of the first disposable material portion 55A and the filler material portion 84. In one embodiment, the fill material portion 84 can be removed simultaneously with removal of the first disposable material portion 55A. A first gate cavity 85A is formed in a volume from which the first disposable material portion 55A, and a second gate cavity 85B is formed in a volume from which the fill material portion 84 is removed.

The combination of the first planar semiconductor oxide-based dielectric portion 50A and the planar high dielectric constant (high-k) dielectric portion 51 constitutes a first gate dielectric (50A, 51), which is the gate dielectric of a first field effect transistor to be formed in the first device region R1. The entirety of the first gate dielectric (50A, 51) is planar, and has a uniform thickness throughout.

The combination of the chemical oxide layer 80 and the U-shaped high-k dielectric portion 81 constitutes a second gate dielectric (80, 81), which is the gate dielectric of a second field effect transistor to be formed in the second device region R2. The second gate dielectric (80, 81) is a U-shaped gate dielectric having vertical portions and a horizontal portion. Each vertical portion of the second gate dielectric (80, 81) is a vertical portion of the U-shaped high-k dielectric portion 81, and the horizontal portion of the second gate dielectric (80, 81) is a stack of the horizontal portion of the U-shaped high-k dielectric portion 81 and the chemical oxide layer 80. In one embodiment, each vertical portion of the second gate dielectric (80, 81) can have a uniform lateral thickness, and each horizontal portion of the second gate dielectric (80, 81) can have a uniform vertical thickness.

Figure 10:
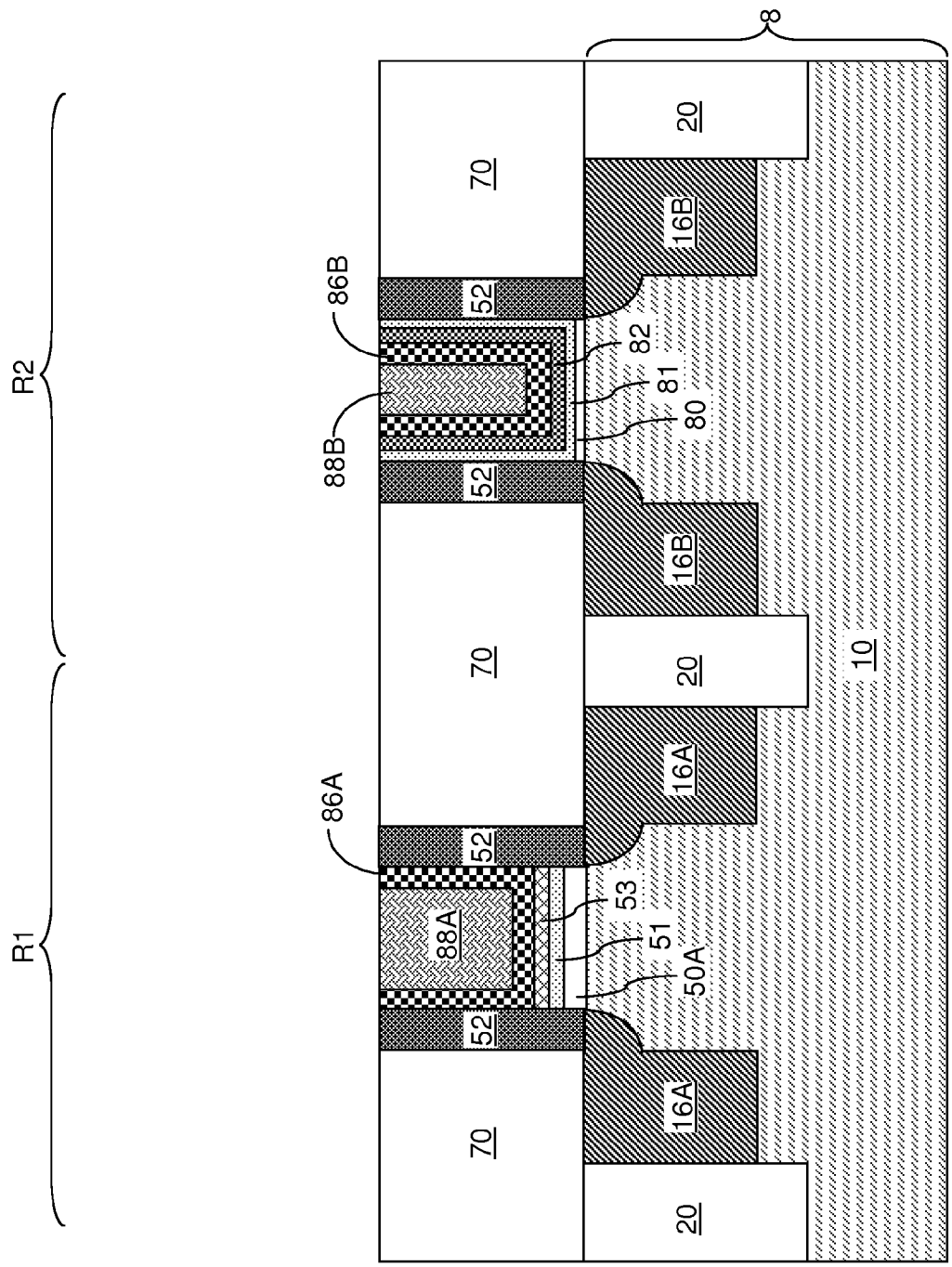
FIG. 10 is a vertical cross-sectional view of the first exemplary semiconductor structure after deposition and planarization of a contiguous work function material layer and a conductive material layer and according to the first embodiment of the present disclosure.

Referring to FIG. 10, a contiguous work function material layer and a conductive material layer can be deposited in the first and second gate cavities (85A, 85B) and over the planarization dielectric layer 70. The contiguous work function material layer can include any conductive material that can affect the work function of the first and second field effect transistors to be formed in the first and second device regions (R1, R2). Exemplary materials that can be employed for the contiguous work function material layer include, but are not limited to, TiN, TaN, WN, Ti, Ta, and W. The contiguous work function material layer can be deposited, for example, by chemical vapor deposition (CVD), physical vapor deposition (PVD), atomic layer deposition (ALD), or a combination thereof. The thickness of the contiguous work function material layer can be in a range from 1 nm to 30 nm, although lesser and greater thicknesses can also be employed. In one embodiment, multiple contiguous work function material layers may be employed in lieu of a single contiguous work function material layer.

The conductive material layer includes a conductive material, which can be an elemental metal, an intermetallic alloy, a conductive metallic nitride, a conductive metallic oxide, a doped semiconductor material, or a combination thereof. The thickness of the deposited conductive material layer is selected such that the first and second cavities (85A, 85B) are completely filled with the conductive material layer. The conductive material layer can be deposited, for example, by chemical vapor deposition (CVD), physical vapor deposition (PVD), atomic layer deposition (ALD), or a combination thereof.

Excess portions of the conductive material layer and the contiguous work function material layer can be removed from above the top surface of the planarization dielectric layer 70 by a planarization process, which can employ, for example, chemical mechanical planarization (CMP). Remaining portions of the contiguous work function material layer in the first and second device regions (R1, R2) constitute a first U-shaped work function material portion 86A and a second U-shaped work function material portion 86B, respectively. Remaining portions of the conductive material layer in the first and second device regions (R1, R2) constitute a first conductive material portion 88A and a second conductive material portion 88B, respectively.

The assembly of the planar metallic material portion 51, the first U-shaped work function material portion 86A, and the first conductive material portion 88A constitutes a first gate electrode (53, 86A, 88A), which functions as the gate electrode of the first field effect transistor in the first device region R1. The assembly of the U-shaped metallic material portions 82, the second U-shaped work function material portion 86B, and the second conductive material portion 88B constitutes a second gate electrode (82, 86B, 88B), which functions as the gate electrode of the second field effect transistor in the second device region R2.

The first gate electrode (53, 86A, 88A) is formed over the first planar semiconductor oxide-based dielectric portion 50A, and the second gate electrode (82, 86B, 88B) is formed within a volume laterally bounded by the U-shaped high-k dielectric portion 81 by deposition and planarization of the contiguous work function material layer and the conductive material layer. The first gate electrode (53, 86A, 88A) includes the first U-shaped work function material portion 86A and the first conductive material portion 88A. The second gate electrode (82, 86B, 88B) includes the second U-shaped work function material portion 86B and the second conductive material portion 88B. The first and second U-shaped work function material portions (86A, 86B) can have the same composition and the same thickness.

The first field effect transistor includes a first gate structure, which includes a stack of the first gate dielectric (50A, 51) and the first gate electrode (53, 86A, 88A). The second field effect transistor includes a second gate structure, which includes a stack of the second gate dielectric (80, 81) and the second gate electrode (82, 86B, 88B). The second gate electrode (82, 86B, 88B) is laterally surrounded by vertical portions of the U-shaped high-k dielectric portion 81.

In one embodiment, the semiconductor material layer 10 of the semiconductor substrate 8 can include a semiconductor material, and the first planar semiconductor oxide-based dielectric portion 50A can include a dielectric material selected from a dielectric oxide of the semiconductor material and a dielectric oxynitride of the semiconductor material. In one embodiment, the first planar semiconductor oxide-based dielectric portion 50A can have a greater thickness than the chemical oxide layer 80.

In one embodiment, the planar high-k dielectric portion 51 can have a different composition or a different thickness than the U-shaped high-k dielectric portion 81. In one embodiment, the first U-shaped work function material portion 86A contacts a top surface of the planar metallic material portion 53, and the second U-shaped work function material portion 86B contacts the U-shaped metallic material portion 82. The U-shaped metallic material portion 82 can be in contact with the U-shaped high-k dielectric portion 81 and the second U-shaped work function material portion 86B. The planar metallic material portion 53 and the U-shaped metallic material portion 82 can have different compositions or have different thicknesses.

Figure 11:
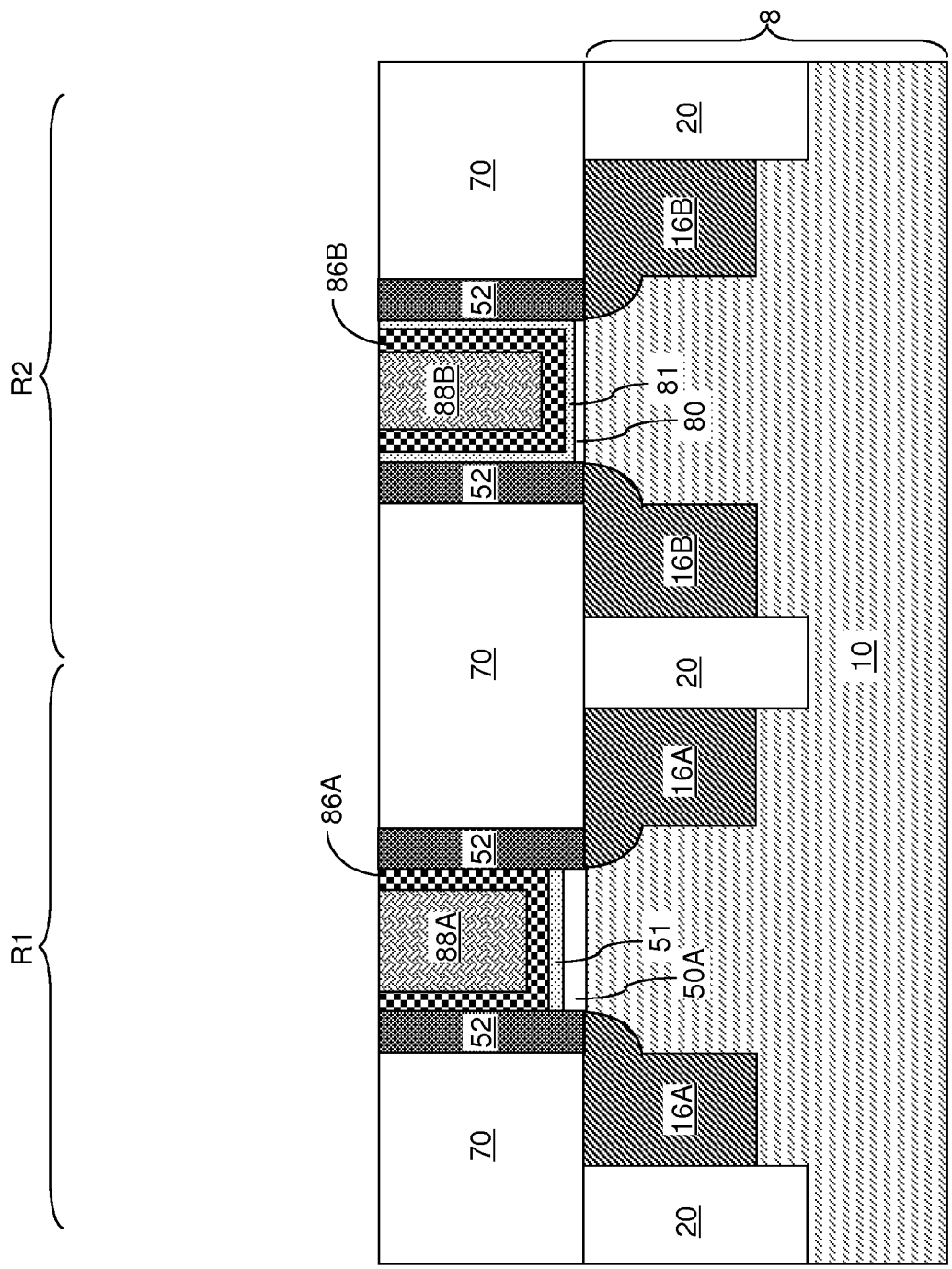
FIG. 11 is a vertical cross-sectional view of a second exemplary semiconductor structure after removal of a planar metallic material portion and a U-shaped metallic material portion and deposition and planarization of a contiguous work function material layer and a conductive material layer and according to a second embodiment of the present disclosure.

Referring to FIG. 11, a second exemplary semiconductor structure according to a second embodiment of the present disclosure can be derived from the first exemplary semiconductor structure of FIG. 9 by removing the planar metallic material portion 53 from underneath the first gate cavity 85A and the U-shaped metallic material portion 82 from around the second gate cavity 85B, and by subsequently performing the processing steps of FIG. 10. The removal of the planar metallic material portion 53 and the U-shaped metallic material portion 82 can be performed selective to the gate spacers 52 and the materials of the planar high-k dielectric portion 51 and the U-shaped high-k dielectric portion 81. For example, the removal of the planar metallic material portion 53 and the U-shaped metallic material portion 82 can be performed employing a wet etch chemistry that etches metallic materials selective to dielectric materials.

Due to the absence of a planar metallic material portion or a U-shaped metallic material portion at the processing steps corresponding to the processing steps of FIG. 10, the first U-shaped work function material portion 86A is formed directly on the top surface of the planar high-k dielectric portion 51, and the second U-shaped work function material portion 86B is formed directly on the top surface and inner surfaces of the U-shaped high-k dielectric portion 81.

The assembly of the first U-shaped work function material portion 86A and the first conductive material portion 88A constitutes a first gate electrode (86A, 88A), which functions as the gate electrode of the first field effect transistor in the first device region R1. The assembly of the second U-shaped work function material portion 86B and the second conductive material portion 88B constitutes a second gate electrode (86B, 88B), which functions as the gate electrode of the second field effect transistor in the second device region R2.

The first gate electrode (86A, 88A) is formed over the first planar semiconductor oxide-based dielectric portion 50A, and the second gate electrode (86B, 88B) is formed within a volume laterally bounded by the U-shaped high-k dielectric portion 81 by deposition and planarization of the contiguous work function material layer and the conductive material layer. The first gate electrode (86A, 88A) includes the first U-shaped work function material portion 86A and the first conductive material portion 88A. The second gate electrode (86B, 88B) includes the second U-shaped work function material portion 86B and the second conductive material portion 88B. The first and second U-shaped work function material portions (86A, 86B) can have the same composition and the same thickness.

The first field effect transistor includes a first gate structure, which includes a stack of the first gate dielectric (50A, 51) and the first gate electrode (86A, 88A). The second field effect transistor includes a second gate structure, which includes a stack of the second gate dielectric (80, 81) and the second gate electrode (86B, 88B). The second gate electrode (86B, 88B) is laterally surrounded by vertical portions of the U-shaped high-k dielectric portion 81.

In one embodiment, the semiconductor material layer 10 of the semiconductor substrate 8 can include a semiconductor material, and the first planar semiconductor oxide-based dielectric portion 50A can include a dielectric material selected from a dielectric oxide of the semiconductor material and a dielectric oxynitride of the semiconductor material. In one embodiment, the first planar semiconductor oxide-based dielectric portion 50A can have a greater thickness than the chemical oxide layer 80.

In one embodiment, the planar high-k dielectric portion 51 can have a different composition or a different thickness than the U-shaped high-k dielectric portion 81. In one embodiment, the first U-shaped work function material portion 86A contacts a top surface of the planar high-k dielectric portion 51, and the second U-shaped work function material portion 86B contacts the U-shaped high-k dielectric portion 81. Thus, the planar metallic material portion 53 can be in contact with the top surface of the planar high-k dielectric portion 51 and the bottom surface of the first U-shaped work function material portion 86A.

The various embodiments of the present disclosure can be employed to provide multiple types of gate dielectrics having different thicknesses. Particularly, the first gate dielectric (50A, 51) can be a planar gate dielectric having a uniform thickness throughout, and the second gate dielectric (80, 81) can be U-shaped gate dielectric having vertical portions and horizontal portions. The planar high-k dielectric portion 51 protects the first planar semiconductor oxide-based dielectric portion 50A throughout the processing steps of the present disclosure. The integrity and reliability of the first planar semiconductor oxide-based dielectric portion 50A, and thus, the integrity of the first gate dielectric (50A, 51), can be enhanced over prior art schemes in which a top surface of a planar semiconductor oxide-based dielectric portion is subjected to an etchant during an etch process or a preclean process.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising a first field effect transistor and a second field effect transistor located on a semiconductor substrate, said first field effect transistor comprising a first gate structure and said second field effect transistor comprising a second gate structure,
    wherein said first gate structure comprises a stack of a planar semiconductor oxide-based dielectric portion, a planar high dielectric constant (high-k) dielectric portion, and a first gate electrode, and
    wherein said second gate structure comprises a stack of a chemical oxide layer contacting a surface of said semiconductor substrate, a U-shaped high-k dielectric portion, and a second gate electrode laterally surrounded by vertical portions of said U-shaped high-k dielectric portion.

2. The semiconductor structure of claim 1, wherein said planar high-k dielectric portion has a different composition or a different thickness than said U-shaped high-k dielectric portion.

3. The semiconductor structure of claim 1, wherein said semiconductor substrate comprises a semiconductor material, and said planar semiconductor oxide-based dielectric portion comprises a dielectric material selected from a dielectric oxide of said semiconductor material and a dielectric oxynitride of said semiconductor material.

4. The semiconductor structure of claim 1, wherein said planar semiconductor oxide-based dielectric portion has a greater thickness than said chemical oxide layer.

5. The semiconductor structure of claim 1, wherein said first gate electrode comprises a first U-shaped work function material portion and a first conductive material portion, and said second gate electrode comprises a second U-shaped work function material portion and a second conductive material portion.

6. The semiconductor structure of claim 5, wherein said first and second U-shaped work function material portions have a same composition and a same thickness.

7. The semiconductor structure of claim 5, wherein said first U-shaped work function material portion contacts a top surface of said planar high-k dielectric portion, and said second U-shaped work function material portion contacts said U-shaped high-k dielectric portion.

8. The semiconductor structure of claim 5, wherein said first gate electrode further comprises a planar metallic material portion in contact with a top surface of said planar high-k dielectric portion and a bottom surface of said first U-shaped work function material portion.

9. The semiconductor structure of claim 8, wherein said second gate electrode further comprises a U-shaped metallic material portion in contact with said U-shaped high-k dielectric portion and said second U-shaped work function material portion.

10. The semiconductor structure of claim 9, wherein said planar metallic material portion and said U-shaped metallic material portion have different compositions or have different thicknesses.

* * * * *